United States Patent [19]
Ryat

[11] Patent Number: 5,389,894
[45] Date of Patent: Feb. 14, 1995

[54] POWER AMPLIFIER HAVING HIGH OUTPUT VOLTAGE SWING AND HIGH OUTPUT DRIVE CURRENT

[75] Inventor: Marc H. Ryat, Santa Clara, Calif.

[73] Assignee: SGS-Thomson Microelectronics, Inc., Carrollton, Tex.

[21] Appl. No.: 940,076

[22] Filed: Sep. 3, 1992

[51] Int. Cl.⁶ ........................... H03F 3/45; H03F 3/30
[52] U.S. Cl. .................................... 330/255; 330/257; 330/258; 330/273
[58] Field of Search ............... 330/252, 255, 257, 258, 330/262, 271, 273, 274

[56] References Cited

U.S. PATENT DOCUMENTS

| 4,587,491 | 5/1986 | Koterasawa | 330/274 X |
| 4,803,442 | 2/1989 | Hogg | 330/274 |
| 4,853,645 | 8/1989 | Seevinch et al. | 330/255 |
| 5,166,636 | 11/1992 | Bien | 330/255 |

FOREIGN PATENT DOCUMENTS 2127247 4/1984 United Kingdom .

OTHER PUBLICATIONS

Bowers, "A 20-μW Precision Operatinal Amplifier," IEEE Journal of Solid-State Circuits, vol. SC-22, No. 3, Jun. 1987 pp. 322-329.
Seevinck, et al., "A Low-Distortion Circuit Output Stage with Improved Stability for Monolithic Power Amplifiers", IEEE Journal of Solid State Circuits, vol. 23, No. 3, Jun., 1988, pp. 794-801.
R. J. Wildar, "Low-voltage techniques", IEEE Jour. Solid State Cir., vol. SC-13, pp. 836-846, Dec. 1978.
Huijsing et al., "Low-voltage operational amplifier with rail-to-rail input and output ranges", IEEE J. Solid State Cir., vol. SC-20, No. 6, pp. 1144-1150, Dec. 1985.
Fonderie et al., IEEE J. Solid State Cir., vol. SC-24, No. 6, pp. 1551-1559 Dec. 1989.
Callewaert et al, "Class AB CMOS amplifiers with high efficiency", IEEE J. Solid State Cir., vol. 25, No. 3, pp. 684-692, Jun. 1990.
Brehmer et al., "Large-swing CMOS power amplifier", IEEE J. Solid State Cir. vol. SC-18, pp. 624-629, Dec. 1983.
Fisher, "A high-performance CMOS power amplifier", IEEE J. Solid State Cir. vol. SC-20, No. 6, pp. 1200-1205, Dec. 1985.
Monticelli, "A quad CMOS single-supply op amp with rail-to-rail output swing", IEEE J. Solid State Cir., vol. SC-21, No. 6, pp. 1026-1034, Dec. 1986.
Fisher, "A highly linear CMOS buffer amplilfier", (List continued on next page.)

Primary Examiner—James B. Mullins
Attorney, Agent, or Firm—Richard A. Bachand; Rodney M. Anderson; Lisa K. Jorgenson

[57] ABSTRACT

A power amplifier has a signal input stage to which an input signal is applied to produce an input stage output. An input signal amplifier is connected to receive the input signal to produce an amplified input signal from an active device at an output of the input signal amplifier. A push-pull signal output stage has first and second transistors. The first transistor has a current path connected between a supply voltage and an output node, and the second transistor has a current path connected between a reference voltage and the output node. The amplifier output provides variable drive current directly to a base of the first transistor, thereby enabling increased drive current to be realized. The power amplifier also includes a common mode biasing circuit connected to bias the first and second transistors for class AB operation, and the input stage output provides a signal base drive current to the first transistor separate from the common mode biasing circuit. This further increases the drive current that can be supplied to the base of the first transistor. By virtue of the direct connection of the current path of the first transistor between the supply voltage and the output node, and its base connection to the output of the input signal amplifier, the voltage on the base of the first transistor is enabled to swing to within $1V_{ce\ SAT}$ from the supply voltage.

19 Claims, 3 Drawing Sheets

OTHER PUBLICATIONS

IEEE J. Solid State Cir. vol. SC-22, No. 3, pp. 330-334, Jun. 1987.

Steyaier et al., "A high-dynamic-range CMOS op amp with low-distortion output structure", IEEE J. Solid State Cir., vol. SC-22, No. 6, pp. 1204-1207 Dec. 1987.

Babenezhad, "A rail-to-rail CMOS op amp", IEEE J. Solid State Cir., vol. SC-23 No. 6, pp. 1414-1417, Dec. 1988.

Pardoen et al. "A rail-to-rail input/output CMOS power amplifier", IEEE J. Solid State Cir., vol. SC-25, No. 2, pp. 501-504, Apr. 1990.

Babanezhad et al., "A programmable gain/loss circuit", IEEE J. Solid State Cir., vol. SC-22, No. 6, pp. 1082-1090, Dec. 1987.

Nagaraj, "Large-swing CMOS buffer amplifier", IEEE J. Solid State Cir., vol. SC-24, pp. 181-193, Feb. 1989.

Mistlberger et al., "Class-AB high-swing CMOS power amplifier", IEEE J. Solid State Cir., vol. SC-27, No. 7, pp. 1089-1092, Jul. 1992.

Malhi et al., "A low-voltage micropower JFET/bipolar operational amplifier", IEEE J. Solid State Cir., vol. SC-16, No. 6, pp. 669-676, Dec. 1981.

Davis et al., "Design techniques for improving the HF response of a monolithic JFET operational amplifier", IEEE J. S.State Cir., vol., SC-19, No. 6, pp. 978-985 Dec. 1984.

Vyne et al., "A monolithic P-channel JFET quad op amp with in-package trim and enhanced gain-bandwidth product", IEEE J. S.State Cir., vol. SC-22, No. 6, pp. 1130-1138, Dec. 1987.

Seevinck et al., "A low-distortion output stage with improved stability for monolithic power amplifiers", IEEE J. Solid State Cir., vol. SC-23, No. 3 pp. 794-801 Jun. 1988.

Widlar et al., "A monolithic power op amp", IEEE J. S. State Cir., vol. SC-23, No. 2, p. 5270535, Apr. 1988.

Quiting, "A CMOS power amplifier with a novel output structure", IEEE J. Solid State Cir., vol., SC-27, No. 2, pp. 203-207, Feb. 1992.

Fondirie et al., "Operational amplifier with 1-V rail-to-rail multipath-driven Output Stage", IEEE J. Solid State Cir., vol. 26, No. 12, Dec. 1991.

Gilbert, "A new wide-band amplifier technique", IEEE J. Solid State Cir., vol. SC-3, No. 4, Dec. 1968.

Castello et al., "A high-performance micropower switched-capacitor Filter", IEEE J. Solid State Cir., vol. SC-20, No. 6, Dec. 1985.

Fiez et al., "A family of high-swing CMOS operational amplifiers", IEEE J. Solid State Cir., vol. 24, No. 6, pp. 1683-1687, Dec. 1989.

Op't Eynde et al., "A CMOS large-swing low-distortion three-stage class AB power amplifier", IEEE J. Solid State Cir., pp. 265-273, vol., 25, No. 1, Feb. 1900.

Lee et al., "A high-slwe-rate CMOS amplifier for analog signal processing", IEEE J. Solid State Cir., vol. 25, No. 3, p. 885-889, Jun. 1990.

POWER AMPLIFIER HAVING HIGH OUTPUT VOLTAGE SWING AND HIGH OUTPUT DRIVE CURRENT

BACKGROUND OF THE INVENTION

1. Field of the Invention

This invention relates to improvements in power amplifiers, and, more particularly, to improvements in push-pull transistor amplifiers that enable the highest possible output voltage swing and highest possible output current drive for power amplifiers of this type.

2. Description of the Relevant Art

Recently, increased interest has been directed towards realizing low distortion class AB power amplifiers that have low distortion and that can be realized in a monolithic integrated circuit structure.

To this end, for example, Malhi, et al., have proposed a circuit in "A Low-Voltage Micropower JFET/Bipolar Operational Amplifier", *IEEE Journal of Solid-State Circuits*, Vol. SC-16, No. 6, December, 1981, that has an output stage in which when current is sinked through the lower output transistor, the current through the lower output transistor becomes large, and the current through the upper output transistor, becomes nearly zero. This makes the output impedance become very large, and creates stability problems. This problem was addressed by Seevinck, et al. in a circuit described in "A Low-Distortion Output Stage with Improved Stability for Monolithic Power Amplifiers", *IEEE Journal of Solid-State Circuits*, Vol. 23, No. 3, June 1988, in which the output stage of the reference enables operation only as close to $+V_s$ as $V_s - V_{ce\ SAT} - 2V_{be}$ and as close to $-V_s$ as $-V_s + V_{ce\ SAT}$. This circuit has a relatively high output voltage swing capability, and does not use PNP transistors.

A disadvantage of the Seevinck, et al. circuit is that since the base current of the output drive transistor and its associated current sense transistor is supplied by one of the active load transistors of the biasing control loop, if a lot of current is to be sourced from the output drive transistor, the current through the active load transistor needs to be large enough. Thus, large currents need to be supplied to the active load transistor in the bias control loop.

In the Seevinck et al circuit, additionally, large capacitors are required, making integration of all of the constituent parts of the circuit difficult.

SUMMARY OF THE INVENTION

In light of the above, it is, therefore, an object of the invention to provide an improved power amplifier circuit.

It is another object of the invention to provide an improved amplifier circuit that has an increased output voltage swing capability.

It is another object of the invention to provide a quasi-push-pull transistor power amplifier circuit that has an increased drive to the push transistor of the output stage.

It is another object of the invention to provide an improved quasi-push-pull power amplifier circuit in which the drive current to the push transistor of the output stage is provided by an active device.

It is yet another object of the invention to provide an improved quasi-push-pull power amplifier circuit in which the drive current to the push transistor of the output stage is not fixed to a particular fixed value.

It is yet another object of the invention to provide an improved quasi-push-pull power amplifier of the type described in which the voltage swing on the base of the push transistor can swing to as close as $1V_{ce\ SAT}$ from $V_{dd}$.

It is still another object of the invention to provide an improved power amplifier circuit that can operate at reduced supply voltages to produce an output that is equivalent to that of prior art amplifiers that operate at higher supply voltages.

It is still another object of the invention to provide an improved power amplifier circuit that has improved phase and gain margins.

It is still another object of the invention to provide an improved quasi-push-pull power amplifier of reduced size that provides increased current to the base of the push transistor of the output stage.

It is still another object of the invention to provide a power amplifier that is stable at high currents.

These and other objects, features and advantages of the invention will be apparent to those skilled in the art from the following detailed description of the invention, when read in conjunction with the accompanying drawings and appended claims.

In accordance with a broad aspect of the invention, a power amplifier is presented. The power amplifier has a signal input stage to which an input signal is applied to produce an input stage output. An input signal amplifier is connected to receive the input signal to produce an amplified input signal from an active device at an output of the input signal amplifier. A push-pull signal output stage has first and second transistors. The first transistor has a current path connected between a supply voltage and an output node, and the second transistor has a current path connected between a reference voltage and the output node. The amplifier output provides variable drive current directly to a base of the first transistor, thereby enabling increased drive current to be realized.

The power amplifier also includes a common mode biasing circuit connected to bias the first and second transistors for class AB operation, and the input stage output provides a signal base drive current to the first transistor separate from the common mode biasing circuit. This further increases the drive current that can be supplied to the base of the first transistor.

By virtue of the direct connection of the current path of the first transistor between the supply voltage and the output node, and its base connection to the output of the input signal amplifier, the voltage on the base of the first transistor is enabled to swing to within $1V_{ce\ SAT}$ from the supply voltage.

BRIEF DESCRIPTION OF THE DRAWINGS

Preferred embodiments of the invention are illustrated in the accompanying drawings, in which.

DESCRIPTION OF THE PREFERRED EMBODIMENTS

Figure 1:
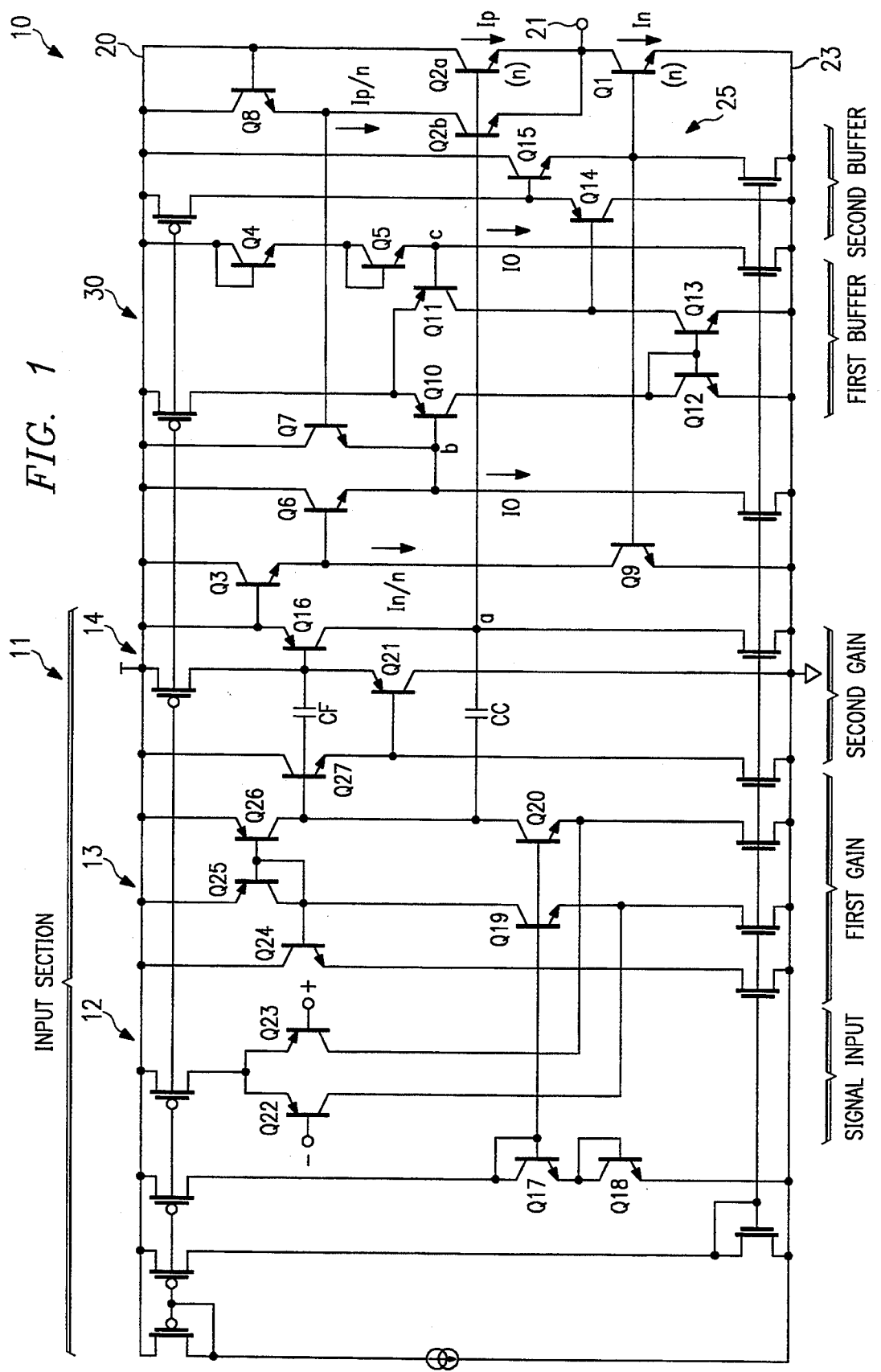
FIG. 1 is an electrical schematic diagram of a power amplifier constructed in accordance with a preferred embodiment of the invention.

An electrical schematic diagram of a power amplifier 10 is shown in FIG. 1, in accordance with a preferred embodiment of the invention. The power amplifier 10 includes an input section 11 that includes a differential signal input circuit 12, a first gain stage 13, and a second gain stage 14. The output from the input amplifier is presented on a node "a" on the collector of a PNP transistor Q16.

The differential input signals that are applied to the respective bases of two PNP transistors Q22 and Q23 are delivered to the emitters of active devices provided by NPN transistors Q19 and Q20, respectively. The PNP transistors Q25 and Q26 serve as active load devices for the active transistors Q19 and Q20 of the first gain stage 13. The second gain stage 14 includes an NPN transistor Q27 and PNP transistors Q21 and Q16. A compensating capacitor CC is connected between the collector of Q28 and output node "a". Additionally, a feed-forward capacitor CF is connected between the collector of PNP transistor Q26 of the first gain stage 13 to the base of the output transistor Q16 of the second gain stage 14 for increased high-frequency performance. The NPN transistor Q27 and PNP transistor Q21 of the second gain stage 14 serve as level shifters, and the PNP transistor Q16 serves as the active device of the second gain stage 14.

At this point, it is noted that the power amplifier 10 is a quasi-push-pull transistor amplifier, and has two output NPN transistors Q2a and Q1. The upper output transistor, or "push" transistor Q2a has its collector connected directly to the supply voltage on line 20 and its emitter connected directly to the output node 21 to provide a current path therebetween. The base of the "push" transistor Q2a is connected directly to node "a" at the collector of the PNP transistor Q16 at the output of the second gain stage 14.

In a similar manner, the collector of the lower output transistor, or "pull" transistor, has its collector connected to the output node 21 and its emitter connected to a reference potential, or ground, on line 23, to provide a current path therebetween, as shown. The base of the lower output transistor Q1 is connected to the emitter of transistor Q15 which serves as the output of a second buffer stage 25 from which it receives its base drive current.

Current sensing in the upper transistor Q2a is performed by NPN transistors Q2b and Q8. The collector of sense transistor Q2b is connected to the emitter of sensing load transistor Q8, and the emitter of the sense transistor Q2b is connected to the output node 21. The base of the sense transistor Q2b is connected to node "a" at the collector of the output transistor Q16 of the second gain stage 14. On the other hand, the collector and base of the sense load transistor Q8 are connected to the supply voltage on line 20.

The ratio of the emitter sizes of the upper output transistor Q2a and the sense transistor Q2b is denoted as "n". Thus, the current that flows in the current path provided by the collector and emitter of the sense transistor Q2b is equal to the current flowing in the upper output transistor Q2a (denoted Ip) divided by the emitter size ratio "n".

In contrast, the current flowing through the lower output transistor Q1 (denoted "In") is sensed by a current mirror that is provided by NPN transistor Q9, in combination with NPN load transistor Q3. The base of transistor Q9 is connected to the base of lower driver transistor Q1. The emitter of the current mirror transistor Q9 is connected to a reference potential or ground on line 23, and the collector is connected to the emitter of the current mirror load transistor Q3. The current mirror load transistor Q3 has its collector and base connected to the supply voltage on line 20. The emitter of the lower driver transistor Q1 is sized with respect to the current mirror transistor emitter to have a ratio of "n" the same ratio as the emitter of the upper driver transistor Q2a has with respect to its sense transistor Q2b; therefore, the current that flows in the current mirror transistor Q9 is In/n.

The upper and lower output transistors Q2a and Q1 are biased with a common mode biasing circuit 30 to operate in class AB mode. The biasing circuit 30 includes two NPN transistors Q3 and Q8, described above, the current paths of which respectively carry the sense currents of the currents flowing in their respective upper and lower output driver transistors Q2a and Q1, respectively. The emitters of the transistors Q3 and Q8 are connected respectively to the bases of NPN transistors Q6 and Q7. The collectors and emitters of the respective NPN transistors Q6 and Q7 are connected to establish a current flow path between the supply voltage on line 20 and node "b". The NPN transistors Q6 and Q7 are biased such that the current that flows through them sums to equal the reference current I0.

In addition, a first buffer circuit is provided that has active PNP transistors Q10 and Q11 with active load transistors Q12 and Q13 connected with a current flow path between the reference potential or ground line 23 and the supply voltage on line 20. The base of the PNP transistor Q10 is connected to node "b". On the other hand, two NPN transistors Q4 and Q5 provide a voltage reference on node "c". The transistors Q4 and Q5 are biased such that a current equal to the reference current, I0, flows in their current flow path. Thus, the emitter of transistor Q5 on node "c" is connected to the base of the PNP transistor Q11 described above.

The operation of the common mode bias circuit is such that if the current Ip flowing in the upper output transistor Q2a in a response to a signal provided on node "a" tends to unbalance the current flowing through the transistors Q6 and Q7, a voltage variation on node "b" is amplified by the first buffer and is reflected via the second buffer Q14 and Q15 transistors to the base of the lower output transistor Q1.

In contrast to prior art circuits, the base of the upper output transistor Q2a is driven by the current provided by a PNP transistor Q16 at the output of the input amplifier, or, more particularly, at the collector of Q16 on node "a" at the output of the second gain stage 14. Thus, the PNP transistor Q16 can supply directly from the power source on line 20 sufficient current to drive the base of the output transistor Q2a; in fact, in applications in which the upper output transistor Q2a is required to source high output currents, the connection illustrated provides the highest possible drive current to the base of the upper output transistor Q2a. Moreover, in contrast to prior art circuits, the output from transistor Q16 is not required to provide drive current to any other circuitry within the power amplifier 10, thus further assuring that the highest possible drive current can be provided to the output transistor Q2a.

In addition to the foregoing, it should be noted that the voltage swing that is enabled by the direct connection of the upper output transistor Q2a between the output node 21 and power supply line 20, without intervening drive transistors enables the voltage swing that can be provided by the upper output transistor Q2a to be within $1V_{be}+V_{ce\,SAT}$ from the supply voltage on line 20. Thus, $1V_{be}$ drop has been eliminated from the circuits of the prior art.

Finally, in addition to the above, since the circuit arrangement described above does not force the current through the lower output transistor to become zero when a high current exists in the upper output transistor, the problems of the prior art in producing high output impedances under high current conditions does not exist. Thus, the harmonic mean class AB current control exists across virtually the entire operating range of the power amplifier 10.

Of course it will be readily appreciated that a circuit fabricated in accordance with the schematic diagram of FIG. 1 can easily be realized in a monolithic integrated circuit structure.

Figure 2:
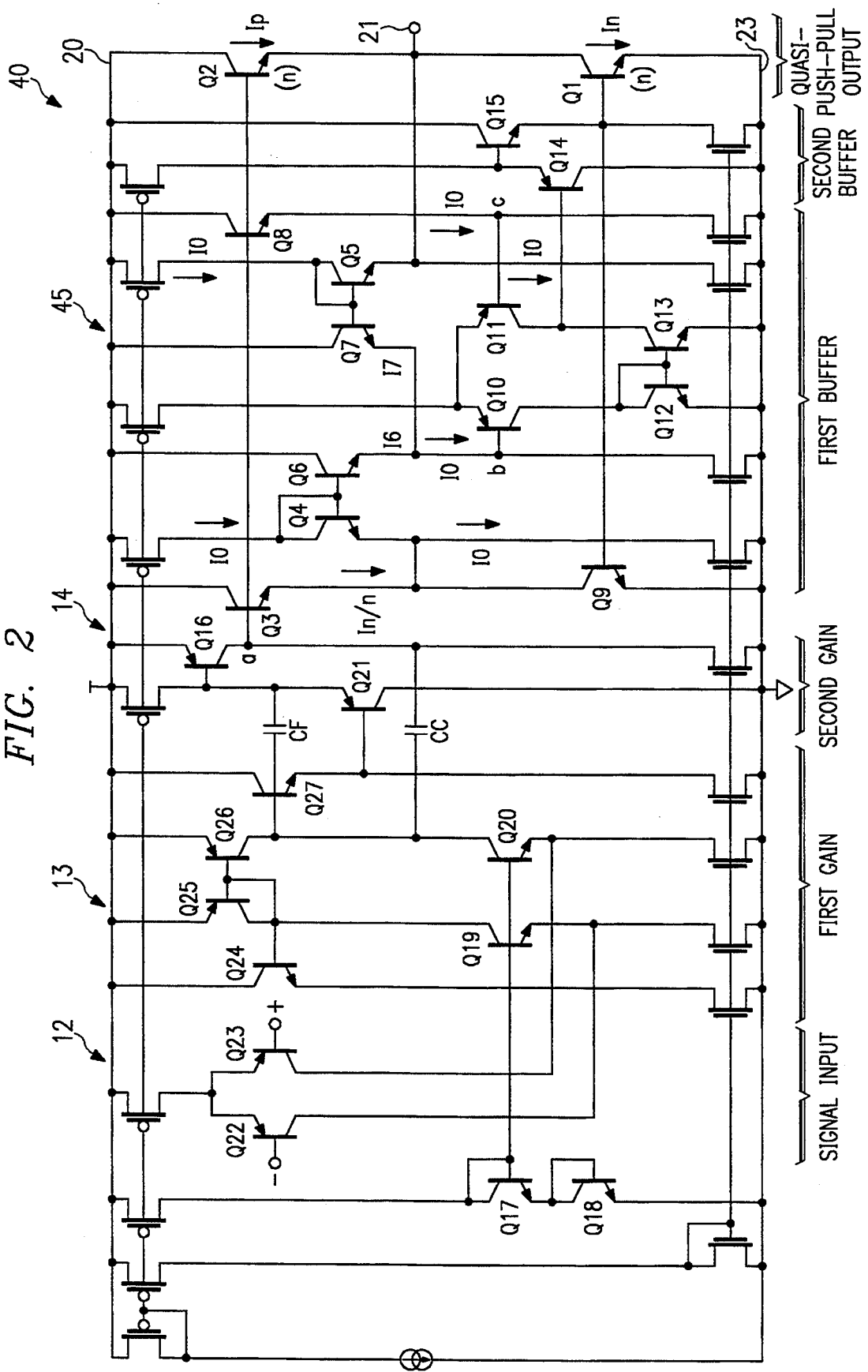
FIG. 2 is an electrical schematic diagram of a power amplifier in accordance with another preferred embodiment of the invention.

With reference now to FIG. 2, an electrical schematic diagram of a power amplifier 40 in accordance with another preferred embodiment of the invention is shown. The power amplifier 40 is constructed similarly to that of the power amplifier 10 described above with reference to FIG. 1 except with respect to the common mode biasing circuitry 45, and the change in the circuit for sensing the current in the upper output driver transistor Q2.

The NPN transistors Q3 and Q2 (with Q5 to Q8) are used to sense the In and Ip currents, and to develop on nodes "b" and "c" a differential voltage that measures their common-mode variations. Thus, voltage Vb–Vc changes the balance of the active PNP transistors Q10 and Q11 of the first buffer stage. The current flowing in the first buffer stage at the collector of the PNP transistor Q11 is connected to the second buffer stage for application to the base of the lower output transistor Q1. It should be noted that transistors Q4, Q5, Q6, and Q7 perform level shifting within the circuit, the NPN transistors Q4 and Q5 maintaining the emitters of NPN transistors Q6 and Q7 at the correct level. In any event, again, the drive current to the upper output transistor Q2 is supplied by the PNP transistor Q16 of the second gain stage 14. Thus, the voltage swing that is permitted in the operation of the upper output transistor Q2 can be made to extend to within $1V_{be}+1V_{ce\,SAT}$ from the supply voltage on line 20. Also, the drive to Q2 can be made very high since Q16 is primarily concerned with the base drive of the output transistor Q2.

Again, the amplifier 40 is configured so that when a high current flows in the lower output transistor Q1, the drive current in the upper output transistor Q2 is not extinguished. Therefore, the circuit 40 does not exhibit high output impedance at higher current levels, and the stability problems resulting therefrom have been eliminated.

Figure 3:
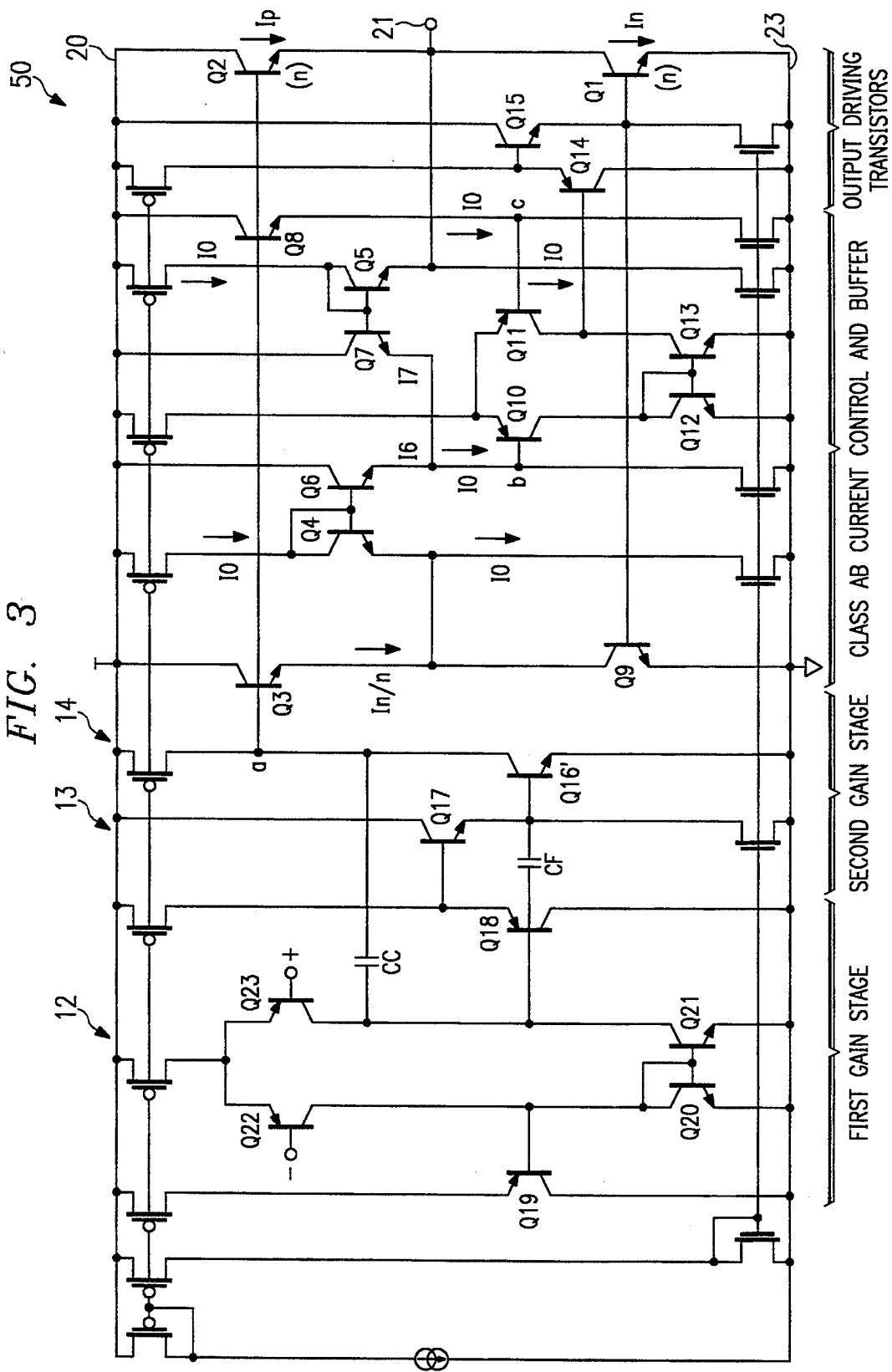
FIG. 3 is an electrical schematic diagram of a power amplifier in accordance with still another preferred embodiment of the invention.

An electrical schematic diagram of another preferred embodiment of a power amplifier 50 is shown in FIG. 3. In the embodiment of FIG. 3, the output from the second gain stage 14 of the transistor Q16' is derived at node "a" connected to the collector; however, in the embodiment of FIG. 3, the transistor Q16' is an NPN transistor. As a result, although the voltage swing, impedance and stability advantages can be achieved with the circuit of FIG. 3, the push current driving result is not quite as favorable. It can be seen that the circuit of FIG. 3 is substantially the same as that of FIG. 2 with the exception of the input amplifier section, and particularly of the second gain stage thereof. The circuit of FIG. 3 derives its primary advantage from the simplicity of components and fewer number of parts required for its realization. The output portion of the circuit 50 is essentially the same as the output section of the power amplifier embodiment 40 of FIG. 2 including the first and second buffer stages and push-pull output stage.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

It is claimed:

1. A power amplifier, comprising:
   a signal input stage to which an input signal is applied to produce an input stage output;
   an input stage amplifier connected to receive said input stage output to produce an amplified input signal at an amplifier output from an active device, comprising:
   a current source; and
   a gain transistor having an emitter, having a base coupled to receive the input signal from the signal input stage, and having a collector connected at the amplifier output to said current source so that the collector-emitter path of the gain transistor and the current source are series-connected between a supply voltage and a reference voltage;
   a quasi-push-pull signal output stage having first and second transistors of the same conductivity type as one another, said first transistor having a current path connected between the supply voltage and an output node and having a base connected to the amplifier output to receive variable drive current therefrom, said second transistor having a current path connected between the reference voltage and said output node; and
   a bias control circuit, comprising:
   circuitry for sensing the currents conducted by the first and second transistors of said quasi-push-pull signal output stage;
   a buffer, having an input coupled to said sensing circuitry and an output coupled to the base of the second transistor of said quasi-push-pull signal output stage, for biasing the second transistor responsive to the sensed currents;
   and wherein the amplifier output provides a signal base drive current to said first transistor separate from said bias control circuit.

2. The power amplifier of claim 1 wherein said bias control circuit biases said first and second transistors for class AB operation.

3. The power amplifier of claim 2, wherein said bias control circuit provides harmonic mean class AB current control.

4. The power amplifier of claim 1 wherein said input stage receives a differential signal input.

5. The power amplifier of claim 1 wherein said first and second transistors are NPN transistors.

6. The power amplifier of claim 5 wherein a voltage on the base of the first transistor swings to within $V_{ce\ SAT}$ from a supply voltage for the power amplifier.

7. A power amplifier, comprising:
    a signal input amplifier stage to which an input signal is applied to produce an input stage amplified output;
    a quasi-push-pull signal output stage having first and second transistors, said first transistor having a current path connected between a supply voltage and an output node, said second transistor having a current path connected between a reference voltage and said output node, said first transistor having a base connected to receive the input stage amplified output; and
    a common mode biasing circuit connected to bias said quasi-push-pull signal output stage for class AB operation comprising:
    a sense circuit for sensing the current conducted by the first transistor;
    a current mirror circuit connected to a base of the second transistor; and
    a buffer, coupled to said sense circuit and to said current mirror circuit, and having an output for biasing the second transistor responsive to the current sensed by said sense circuit and to the current mirrored by said current mirror circuit;
    wherein the input stage amplified output provides a signal base drive current to said first transistor separate from said common mode biasing circuit.

8. The power amplifier of claim 7 wherein said input stage receives a differential signal input.

9. The power amplifier of claim 7 wherein said first and second transistors are NPN transistors.

10. The power amplifier of claim 9 wherein said signal input amplifier stage comprises a PNP transistor for driving the base of said first transistor.

11. The power amplifier of claim 9 wherein said current mirror circuit comprises an NPN transistor.

12. The power amplifier of claim 11 wherein a voltage on the base of the first transistor swings to within $V_{ce\ SAT}$ from a supply voltage for the power amplifier.

13. A push-pull transistor amplifier, comprising:
    a differential signal input stage to which a differential input signal is applied to produce a differential input stage output;
    a first gain stage having a pair of loads and a pair of associated active devices to which said input stage output is applied to produce a first gain stage output from at least one of said active devices;
    a second gain stage having at least one active device to which said first gain stage output is applied to produce a second gain stage output from said at least one active device;
    a first differential buffer stage to which said second gain stage output is applied to produce a first buffer stage output;
    a second buffer stage to which said first buffer stage output is applied to produce a second buffer stage output;
    a push-pull signal output stage having first and second transistors, said first transistor having a current path connected between a supply voltage and an output node, said second transistor having a current path connected between a reference voltage and said output node;
    an output of said second buffer providing drive current to a base of said second transistor;
    an output of said at least one active device of said second gain stage providing drive current to a base of said first transistor.

14. The push-pull transistor amplifier of claim 13 wherein said output of said at least one active device of Said second gain stage provides variable drive current to a base of slid first transistor.

15. The push-pull transistor amplifier of claim 13 wherein a voltage across the first transistor swings to within $1V_{ce\ SAT}$ from the supply voltage.

16. The push-pull transistor amplifier of claim 13 wherein said output stage has harmonic mean class AB current control.

17. The push-pull transistor amplifier of claim 13 wherein said first and second transistors of said output stage are NPN transistors.

18. The push-pull transistor amplifier of claim 17 wherein said at least one active device of said second gain stage is a PNP transistor.

19. The push-pull transistor amplifier of claim 17 wherein said at least one active device of said second gain stage is an NPN transistor.

* * * * *